(12) United States Patent
Lu

(10) Patent No.: US 11,056,174 B2
(45) Date of Patent: Jul. 6, 2021

(54) DYNAMIC RANDOM ACCESS MEMORY WITH SHAPED WORD-LINE WAVEFORM

(71) Applicant: Etron Technology, Inc., Hsinchu (TW)

(72) Inventor: Chao-Chun Lu, Taipei (TW)

(73) Assignees: Etron Technology, Inc., Hsinchu (TW); Invention And Collaboration Laboratory Pte. Ltd., Singapore (SG)

( * ) Notice: Subject to any disclaimer, the term of this patent is extended or adjusted under 35 U.S.C. 154(b) by 0 days.

(21) Appl. No.: 16/702,509

(22) Filed: Dec. 3, 2019

(65) Prior Publication Data

US 2020/0185021 A1 Jun. 11, 2020

Related U.S. Application Data

(60) Provisional application No. 62/775,917, filed on Dec. 6, 2018.

(51) Int. Cl.
| | |
|---|---|
| *G11C 7/22* | (2006.01) |
| *G11C 11/408* | (2006.01) |
| *G11C 11/4074* | (2006.01) |
| *G11C 11/419* | (2006.01) |

(52) U.S. Cl.
CPC .......... *G11C 11/4085* (2013.01); *G11C 7/222* (2013.01); *G11C 11/4074* (2013.01); *G11C 11/419* (2013.01)

(58) Field of Classification Search
CPC . G11C 11/4085; G11C 7/222; G11C 11/4074; G11C 11/419; G11C 2029/5004; G11C 29/50012; G11C 29/06; G11C 29/04; G11C 11/4078; G11C 5/147
USPC .................................................. 365/189.011
See application file for complete search history.

(56) References Cited

U.S. PATENT DOCUMENTS

| | | | | |
|---|---|---|---|---|
| 5,617,369 | A * | 4/1997 | Tomishima | ........... G11C 11/407 365/189.11 |
| 7,289,369 | B2 * | 10/2007 | Matick | ................. G11C 11/4085 365/185.13 |
| 7,957,212 | B2 * | 6/2011 | Kang | ................. G11C 11/40615 365/222 |
| 2001/0038565 | A1 * | 11/2001 | Matsuzaki | ........ G11C 11/40615 365/222 |

* cited by examiner

*Primary Examiner* — Tha-O H Bui
(74) *Attorney, Agent, or Firm* — Winston Hsu

(57) ABSTRACT

A DRAM chip includes a DRAM cell and a first voltage source. The DRAM cell includes an access transistor, and one terminal of the access transistor is coupled to a word line. The first voltage source is selectively coupled to the access transistor via the word line, and generates a first voltage level higher than a sum of a threshold voltage of the access transistor and a voltage level of a signal ONE utilized in the DRAM chip. A whole access cycle includes an access operation period and a restore phase period. When the whole access cycle begins, the one terminal of the access transistor is initially applied by the first voltage level for a first portion of the access operation period and then applied by a second voltage level for a second portion of the access operation period. The second voltage level is lower than the first voltage level.

15 Claims, 5 Drawing Sheets

DYNAMIC RANDOM ACCESS MEMORY WITH SHAPED WORD-LINE WAVEFORM

CROSS REFERENCE TO RELATED APPLICATIONS

This application claims the benefit of U.S. Provisional Application No. 62/775,917, filed on Dec. 6, 2018 and entitled "Shaping Word-line-Waveform Design Technique for Improving Performance and Reliability of DRAM's Access Transistor," the contents of which are incorporated herein by reference.

BACKGROUND OF THE INVENTION

1. Field of the Invention

The present invention relates to a dynamic random access memory (DRAM), and particularly to a DRAM that can utilize a shaped word-line waveform to improve performance and reliability.

2. Description of the Prior Art

The most widely used DRAM (dynamic random access memory) cell has one access transistor and one storage capacitor. The transistor has a source connected to a storage capacitor, a drain connected to a bit-line, and a gate connected to a word-line. The bit-line is further connected to a first-stage sense amplifier which transfers signals read out from the storage capacitor through a column switch to a second-stage sense amplifier, wherein the second-stage sense amplifier is connected to input/output (I/O) lines (or known as data lines). During writing into the DRAM cell, signals driven by I/O buffers need to be stabilized on the data lines which further stabilize data over the first-stage sense amplifier to make right signals written into the storage capacitor through the access transistor. The access transistor is responsible for reading correct data from/writing correct data into the storage capacitor during an active mode (that is, the access transistor is turned on) but also avoids stored signals of the storage capacitor loss when the access transistor is in an inactive mode (that is, the access transistor is turned off).

During turning-off of the access transistor, the access transistor is designed to have a high threshold voltage to minimize the leakage current through the transistor. But the shortcoming result is that the access transistor loses its performance when it is turned ON. As a result, the word-line needs to be bootstrapped or connected to a high VPP (usually from a word-line voltage source) to allow the access transistor to have high drivability for WRITE of signals into the storage capacitor. Such a high VPP is passed through a word-line driver to be loaded onto the word-line or the gate of the access transistor. Since the VPP is a high voltage stress over the access transistor, the dielectric material of the transistor (for example, an oxide layer or a High-K material) must be designed to be thicker than that used for transistors used in other support circuits or peripheral circuits of DRAM (such as command decoder, address decoder, and other I/O circuits, etc.) Therefore, the design of the access transistor faces a challenge of maintaining either high performance or high reliability, and presents a difficult trade-off between reliability and performance. The widely used access transistor design is more focused on accomplishing high reliability but must sacrifice the performance of the access transistor.

In a brief summary, for a conventional access transistor design, the access transistor has the high threshold voltage to reduce the leakage current for helping long retention time of retaining charges in the storage capacitor, a thick gate dielectric material to sustain the high word-line voltage VPP, and would rather sacrifice the performance of the access transistor. As a result, WRITE or READ operation of a signal "ONE" which is usually referred to a voltage VCC takes longer time or cannot completely restore the signal "ONE" (that is, WRITE time is longer to satisfy the voltage VCC to be completely written into the storage capacitor). The commonly used design of the DRAM cell could be illustrated in FIG. 1A. The DRAM cell includes an access transistor 11 and a capacitor 12. The gate of the access transistor 11 is coupled to a word-line (WL) and the cross-coupled sense amplifier 20 is coupled to a source/drain terminal of the access transistor 11 through the bit-line (BL). The DRAM cell uses the access transistor 11 as a switch to control the charges to be stored from the bit-line (BL) into the capacitor in WRITE mode or to be transferred out to bit-line in READ mode, where multiple DRAM cells are connected to the bit-line, respectively. In this example, there are signals ONE (supposed as 1.2 V, and the signal ONE is usually the level voltage of VCCSA provided from the cross-coupled sense amplifier 20) and ZERO (supposed as 0V, and the signal ZERO is usually the level voltage of VSS provided from the cross-coupled sense amplifier 20) latched by a cross-coupled sense amplifier in READ mode by amplifying the signals transferred out by the cell signals on bit-lines, or these signals ONE and ZERO are written from the external to twist the sense amplifier for storing the right signals to the cells in WRITE mode.

FIG. 1B shows the related signal waveforms during access (READ or WRITE) operations of most current DRAMs. To give an example, a 25-nanometer DRAM cell has commonly the following parameters related to (surrounded with) the array design: the bit-line ONE voltage 1.2V, the word-line ON has the VPP up to 2.7V and the word-line OFF has the voltage about −0.3V, the threshold voltage of the cell is ranged around 0.7 to 0.9 V, the access transistor's dielectric must sustain the field strength under 2.7 V (under burn-in stress this number goes up to 3.4V for an acceptable reliability margin), and the word-line driver device must also use the thick gate dielectric so that the performance must be sacrificed. As shown in FIG. 1B, in the beginning, the storage capacitor of the DRAM is in the standby or inactive mode (that is, the access transistor is OFF), the voltage level of the word-line coupled to the gate of the access transistor is a standby negative voltage (−0.3V). The bit-line and bit-line bar are equalized at a voltage level of half-VCCSA between the ONE level at VCCSA=1.2V and the ZERO level of 0 V. When the storage capacitor enters the active mode (that is, the access transistor is ON), the voltage level of the word-line is raised from a standby negative voltage (−0.3V) and pulled up to a high level VPP (such as 2.7 V) which is much higher than the VCCSA (1.2 V) plus the threshold voltage VT of the access transistor (could be 0.7 or 0.8V) to provide sufficiently large drive over the access transistor's Gate-to-Source voltage (e.g. 2.7 V−1.2 V−0.8 V=0.7 V). The bit-line is coupled to the storage capacitor. The word-line is continuously ON at such a high voltage VPP for access operation (such as READ or WRITE). A RESTORE phase is proceeded following the access operation. During the RESTORE phase, the cross-coupled sense amplifier will recharge the storage capacitor based on the signal ONE or ZERO in the storage capacitor. After the RESTORE phase, the word-line is pulled down from VPP to the voltage of word-line at standby mode (−0.3 V) and the access transistor is in the inactive mode.

This high VPP voltage stress causes the access transistor to be designed with a thicker gate-oxide or gate-insulator than that used for the transistors in peripheral circuits, which degrades the access transistor performances such as the worse short-channel effects, the ON-OFF ratio of the transistor currents, and the swing slopes, etc. Moreover, although the threshold voltage is designed to be higher than that used in the transistors of peripheral circuits, the leakage current through the access transistor during the standby mode or inactive mode is still high to degrade the amount of stored charges for sensing.

SUMMARY OF THE INVENTION

An embodiment of the present invention discloses a DRAM chip. The DRAM chip includes a DRAM cell and an access transistor. The access transistor is coupled to the DRAM cell, and the access transistor includes a gate terminal. A whole access cycle includes an access operation period and a restore phase period after the access operation period, and when the whole access cycle begins, the gate terminal of the access transistor is initially applied by a first voltage level for a first portion of the access operation period and then applied by a second voltage level for a second portion of the access operation period. The first voltage level is higher than a sum of a threshold voltage of the access transistor and a voltage level of a signal ONE utilized in the DRAM chip, and the second voltage level is lower than the first voltage level.

According to another embodiment of the present invention, the gate terminal of the access transistor is applied by the first voltage level during the restore phase period. According to another embodiment of the present invention, the gate terminal of the access transistor is applied by a third voltage level during the restore phase period and the third voltage level is different from the first voltage level but higher than the second voltage level. According to another embodiment of the present invention, a standby mode voltage level is applied to the gate terminal of the access transistor before the access operation period and after the restore phase period, and the standby mode voltage level is lower than a voltage level of a signal ZERO utilized in the DRAM chip. According to another embodiment of the present invention, a burn-in stress mode comprises a burn-in access period and a burn-in restore period after the burn-in access period, when the burn-in stress mode begins, a fourth voltage level higher than the first voltage level is initially applied to the gate terminal of the access transistor during a first portion of the burn-in access period and then applied by a fifth voltage level for a second portion of the burn-in access period, wherein the fifth voltage level is lower than the fourth voltage level.

Another embodiment of the present invention discloses a DRAM chip. The DRAM chip includes a DRAM cell, a first voltage source, and a second voltage source. The DRAM cell has an access transistor, and one terminal of the access transistor is coupled to a word line. The first voltage source is selectively coupled to the access transistor via the word line. The second voltage source is selectively coupled to the access transistor via the word line. A whole access cycle includes an access operation period and a restore phase period after the access operation period, and when the whole access cycle begins, the first voltage source is coupled to the one terminal of the access transistor for a first portion of the access operation period, rather than for the whole access operation period, wherein the first voltage source generates a first voltage level which is higher than a sum of a threshold voltage of the access transistor and a voltage level of a signal ONE utilized in the DRAM chip.

According to another embodiment of the present invention, between an end of the first portion of the access operation and a beginning of the restore phase period, the second voltage source is coupled to the one terminal of the access transistor for a second portion of the access operation period, wherein the second voltage source generates a second voltage level which is lower than the first voltage level. According to another embodiment of the present invention, the first voltage source is coupled to the one terminal of the access transistor during the restore phase period. According to another embodiment of the present invention, a period of the first voltage level totally applied to the access transistor is less than 70% of the whole access cycle. According to another embodiment of the present invention, a first switch is coupled between the first voltage source and the word line, and a second switch is coupled between the second voltage source and the word line, wherein the first voltage source is coupled to the one terminal of the access transistor when the first switch is on and the second voltage source is coupled to the one terminal of the access transistor when the second switch is on.

Another embodiment of the present invention discloses a DRAM chip. The DRAM chip includes a DRAM cell. The DRAM cell has an access transistor, wherein one terminal of the access transistor is coupled to a word line and another terminal of the access transistor is coupled to a bit line. A whole access cycle includes an access operation period and a restore phase period after the access operation period, a first voltage level is applied to the one terminal of the access transistor for a first portion of the access operation period, then a second voltage level is applied to the one terminal of the access transistor for a second portion of the access operation period, and a third voltage level is applied to the one terminal of the access transistor for the restore phase period, wherein the first voltage level is higher than a sum of a threshold voltage of the access transistor and a voltage level of a signal ONE utilized in the DRAM chip, and the second voltage level is lower than the first voltage level.

According to another embodiment of the present invention, the first voltage level is applied to the one terminal of the access transistor before the signal ONE of the bit line is well developed. According to another embodiment of the present invention, the second voltage level is higher than a voltage level of a signal ZERO utilized in the DRAM chip. According to another embodiment of the present invention, the first voltage level is substantially equal to the third voltage level.

The present invention provides a DRAM chip. The DRAM chip utilizes a novel shaped waveform applied to a word-line of a DRAM cell included in the DRAM chip, so compared to the prior art, the present invention has advantages as follows: (a) high performance WRITE or READ operation of signals of a storage capacitor of the DRAM cell, respectively, (b) highly acceptable reliability, and (c) lower leakage current through an access transistor of the DRAM cell.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Some of the embodiments will be described in detail, with reference to the following figures, wherein like designations denote like members, wherein.

DETAILED DESCRIPTION

A detailed description of the hereinafter described embodiments of the disclosed apparatus and method are presented herein by way of exemplification and not limitation with reference to the Figures. Although certain embodiments are shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of embodiments of the present invention.

The present invention discloses a DRAM cell with novel shaped word-line waveform (that is, voltage values in the time domain) design, which further results in an access transistor design to optimize the trade-off among (a) high performance WRITE or READ operation of signals of a storage capacitor of the DRAM cell, respectively, (b) highly acceptable reliability, and (c) lower leakage current through an access transistor of the DRAM cell.

Figure 2:
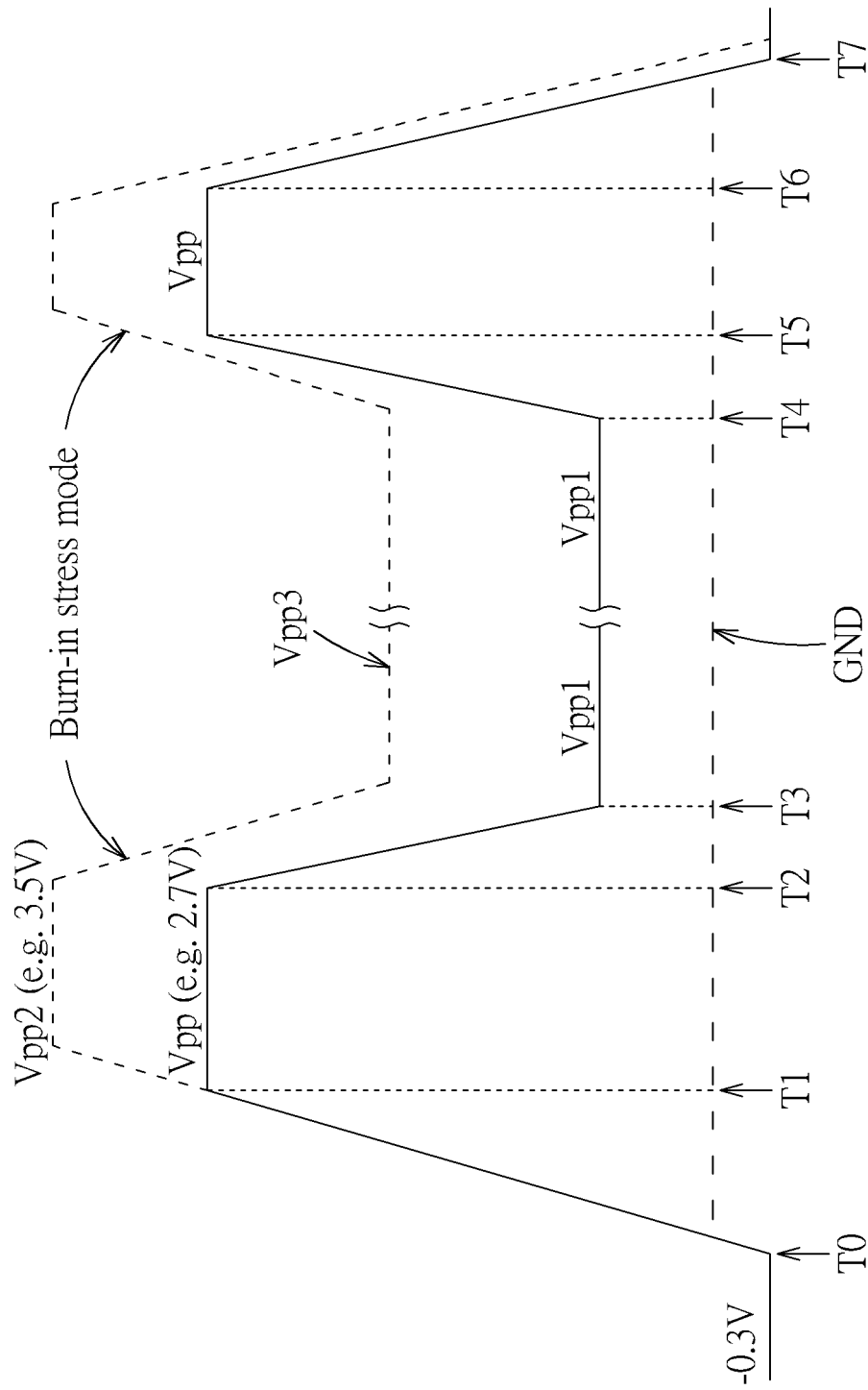
FIG. 2 is a diagram showing a shaped waveform.

Please refer to FIG. 2 which shows a shaped word-line waveform for DRAM operation according to one embodiment of this invention. As mentioned, a 25-nanometer DRAM cell design has commonly the following parameters: the bit-line ONE voltage 1.2V, the word-line ON has the VPP up to 2.7V and the word-line OFF has the voltage about −0.3V, the threshold voltage of the cell is ranged around 0.7 to 0.9 V, the access transistor's dielectric must sustain the field strength under 2.7 V. By starting from a standby mode of the DRAM, the word-line WL is biased at −0.3 V in order to fully turn off the access transistor. In this embodiment, the VCCSA is set to 1.2V and VSS is set to 0V. The level of signal ONE is 1.2V and a voltage level of signal ZERO is 0 V (GND) in this example. The bit-line (BL) and bit-line bar (BLB) are equalized at a voltage level of 0.6V between the signal ONE level at VCCSA=1.2V and the signal ZERO level at VSS=0V.

At T0, the voltage level of the word-line is ramping up from −0.3 V to 2.7 V which is much higher than the VCCSSA of 1.2 V and the access transistor's threshold voltage of 0.8 V to give enough driving for the turned-on access transistor 11 to transfer either the signal ONE or ZERO to the bit-lines, wherein −0.3 V represents a standby mode voltage level and VPP (2.7V) represents a first voltage level, the first voltage level is higher than a sum of the threshold voltage (0.8V) of the access transistor and a voltage level of the signal ONE (1.2V), and the first voltage level is applied to the gate of the access transistor before the signal ONE of the bit line (BL) is well developed. Until the signal is developed to a certain magnitude the sense amplifier 20 is activated to amplify the signal across the bit-line (BL) and bit-line bar (BLB). After T1 (that is, a whole access cycle begins, wherein the whole access cycle includes an access operation period and a restore phase period after the access operation period, and the access operation period is less than 70% of the whole access cycle), when the signals of the bit-line (BL) and bit-line bar (BLB) are well developed to T2, e.g. the signal is read from or written into the capacitor of the DRAM cell, the voltage level of the word-line is reduced to a lower voltage VPP1 (such as VCCSA+ delta V or VCCSA−delta V, wherein delta V could be around 0.1~0.3V) close to or equal to the voltage VCCSA at T3, wherein VPP1 represents a second voltage level. In one embodiment, VPP1 could be around 1.0V~1.4V.

A first portion of the access operation period includes the period between T1 and T2, and a second portion of the access operation period includes the period between T3 and T4. A VPP (2.7V) is applied to the word-line WL for the first portion of the access operation period, but a VPP1 lower than VPP is applied to the word-line WL for the second portion of the access operation period. So the time for the word-line voltage VPP dropped over a gate dielectric of the access transistor is reduced, that is, a duty cycle of having the word-line voltage VPP over the access transistor is sharply reduced. In addition, in another embodiment of the present invention, the duty cycle is selectively adjusted. Therefore, the gate dielectric of the access transistor can use a thinner insulator material (like oxide or high-K dielectric material commonly applied to high-K metal-gate structure of the access transistor) which can result in better performance or higher reliability and lower leakage current through the access transistor at the standby mode.

Afterward, a command signal is initiated to restore the signals, either by writing new signals coming through column switches or no change of the signals to be stored. Then, the voltage level of the word-line is first pulled up from the lower voltage VPP1 (at T4) to the higher voltage VPP for a period between T5 and T6, which does give enough driving capacity from a gate of the access transistor to a source of the access transistor. A restore phase period includes the period between T5 and T6, and a third voltage level is applied to the word-line WL for the restore phase period. The third voltage level could be Vpp as shown in FIG. 2. However, in another embodiment of the present invention, the third voltage level is different from the first voltage level but higher than the second voltage level. Until the signal stored into the storage capacitor is strong enough (either the signal "ZERO" or the signal "ONE"), the voltage of the word-line is pulled down to the standby mode voltage level (e.g. −0.3 V) at the standby mode at T7. During the restore phase period, the gate of the access transistor is loaded by the word-line voltage VPP for a reasonably short time (between T5 and T6 shown in FIG. 2) which minimizes the duty cycle of high voltage stress over the access transistor. In addition, as shown in FIG. 2, the standby mode voltage level is applied to word-line WL before the access operation period and after the restore phase period, and the standby mode voltage level could be lower than the voltage level of the signal ZERO utilized in the DRAM.

Thus, the shaped word-line waveform in this embodiment minimizes the reliability concerns by having the word-line voltage VPP dropped on both the access transistor and a word line driver, and thus a thinner gate dielectric material and a better transistor structure of the access transistor can be achieved. The lower voltage VPP1 applied to the gate of the access transistor between T3 and T4 can make significant improvement on the reliability, especially in a burn-in stress mode, wherein the burn-in stress mode includes a burn-in access period and a burn-in restore period after the burn-in access period. At the burn-in stress mode, the voltage level of the word-line (shown in FIG. 2 by dash line) is usually pulled up at a voltage level VPP2 (a fourth voltage level, such as, 3.5V) which is higher than VPP for a first portion (between T1 and T2) of the burn-in access period, then the shaped waveform with lower voltage VPP3 (a fifth voltage level) for a second portion (between T3 and T4) of the burn-in access period, rather than using a long duty cycle of VPP2 to unnecessarily over stress the gate of the access transistor, becomes even more important. In addition, the fifth voltage level is lower than the fourth voltage level.

Figure 3:
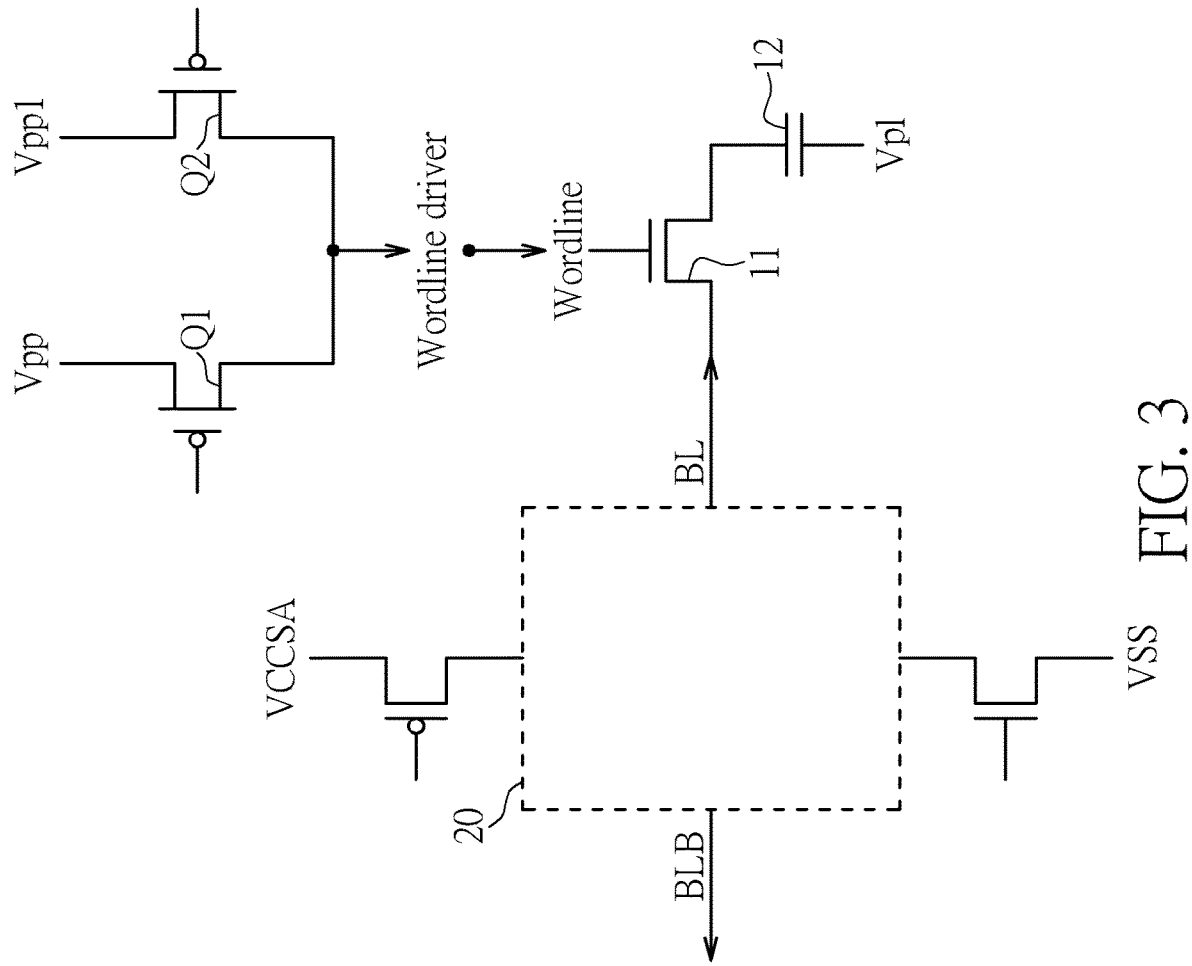
FIG. 3 is a diagram showing a design to accomplish the above mentioned shaped waveform.

FIG. 3 shows an exemplary design how to apply the word-line voltage VPP and then to change to the lower voltage VPP1 and subsequently to change to the word-line voltage VPP. Both the word-line voltage VPP and the lower voltage VPP1 can be generated by a voltage pump technique commonly used by current DRAM chips or can be generated by a bootstrapped technique as described in the U.S. Pat. Nos. 4,639,622 or 4,678,941. In one embodiment, as shown in FIG. 3, p-type metal-oxide-semiconductor (PMOS) transistors Q1, Q2 are used for a pass gate to allow the word-line voltage VPP or the lower voltage VPP1 to be loaded to the word line driver. So at the standby mode, the both PMOS transistors Q1 and Q2 are turned off by having high voltages on gates of the PMOS transistors Q1 and Q2 to allow the word line to stay at −0.3 V. When the word-line voltage VPP is needed, a voltage of the gate of the PMOS transistor Q1 is pulled down by a signal (such as a command 1), so the PMOS transistor Q1 is turned on to pass the word-line voltage VPP over the word-line driver and the word-line. When the voltage of the word line is required down to the lower voltage VPP1, the PMOS transistor Q2 is turned on by another signal (such as a command 2) and the PMOS transistor Q1 is turned off, which results in the word-line waveform drawn in FIG. 2. For example, at the time T2, the voltage of the word-line will be pulled down from the word-line voltage VPP to the lower voltage VPP1. At the time T4, the PMOS transistor Q2 is turned off and the PMOS transistor Q1 is turned on so that the voltage of the word-line is pulled up from the lower voltage VPP1 to the word-line voltage VPP. Since the gate-to-source voltage needs to sustain the word-line voltage VPP in a voltage pump design, a thicker dielectric material may be need for only those related transistors. The present invention avoids that the access transistor must use a thicker dielectric material because the duty cycle of having the word-line voltage VPP over the gate of the access transistor becomes shorter than the duty cycle of the prior art.

Figure 4:
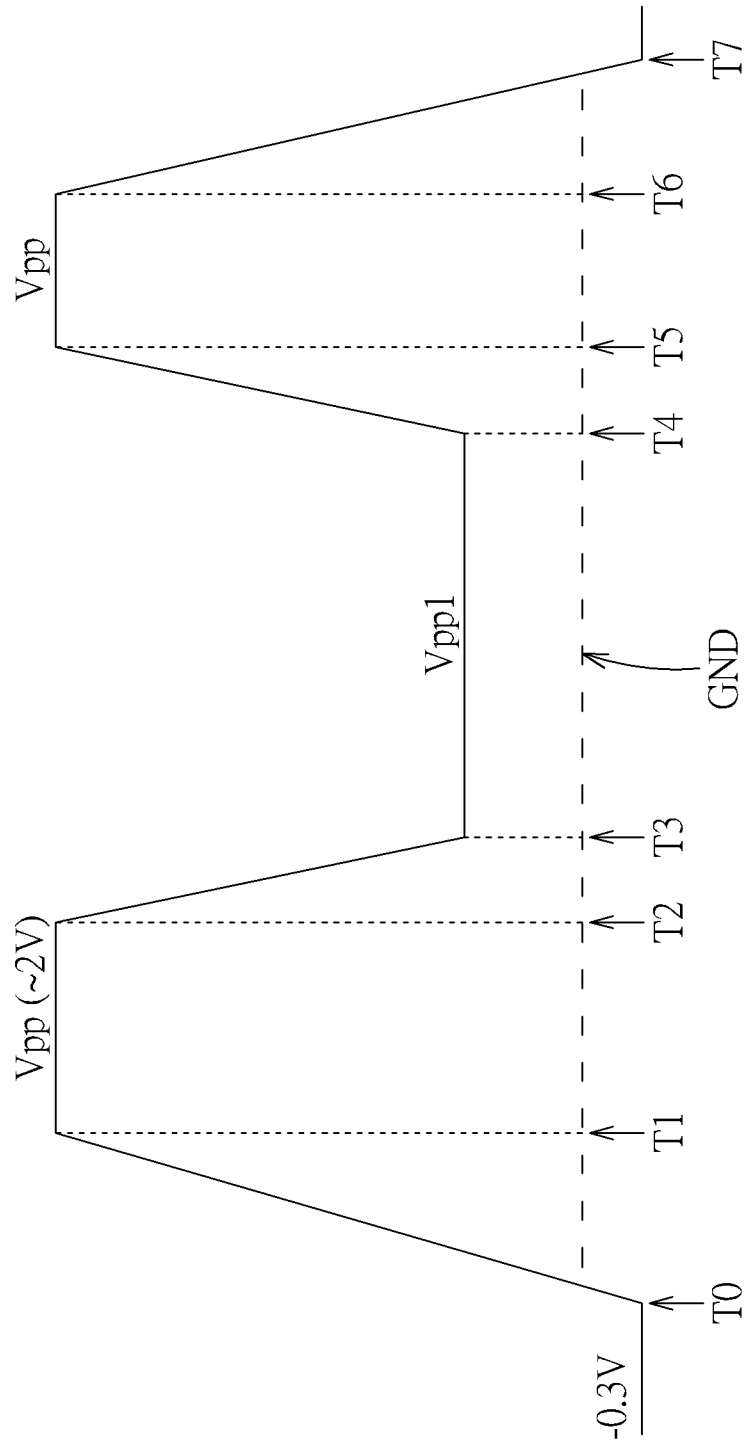
FIG. 4 is a diagram showing another shaped waveform.

The above-mentioned shaped word-line waveform could be applied to other DRAM cell design. For example, a 12 nm or 7 nm DRAM cell design has commonly the following parameters: the bit-line ONE voltage 0.6 V, the word-line ON has the VPP up to 2V, and the word-line OFF has the voltage about −0.3V. As shown in FIG. 4, by starting from the standby mode of the DRAM, the word-line WL is biased at −0.3 V in order to fully turn off the access transistor. At T0, the voltage level of the word-line is ramping up from −0.3 V to the VPP (2V) which is much higher than the VCCSSA of 0.6 V to give enough driving for the turned-on access transistor to transfer either the signal ONE or ZERO to the bit-lines. Until the signal is developed to a certain magnitude the sense amplifier is activated to amplify the signal across the bit-line (BL) and bit-line bar (BLB). After T1, when the signals of the bit-line (BL) and bit-line bar (BLB) are well developed to T2, the voltage level of the word-line is reduced to a lower voltage VPP1 (e.g. 0.4 V~0.8V or 0.6 V~1V, such as 0.65V or 0.7 V) at T3. So the time for the word-line voltage VPP (2V) dropped over a gate dielectric of the access transistor is reduced, that is, a duty cycle of having the word-line voltage VPP over the access transistor is sharply reduced. Afterward, the voltage level of the word-line is first pulled up from the lower voltage VPP1 (at T4) to the higher voltage VPP for a period between T5 and T6, which does give enough driving capacity from a gate of the access transistor to a source of the access transistor. Until the signal stored into the storage capacitor is strong enough (either the signal "ZERO" or the signal "ONE"), the voltage of the word-line is pulled down to a voltage at the standby mode (e.g. −0.3 V) at T7.

Figure 1A:
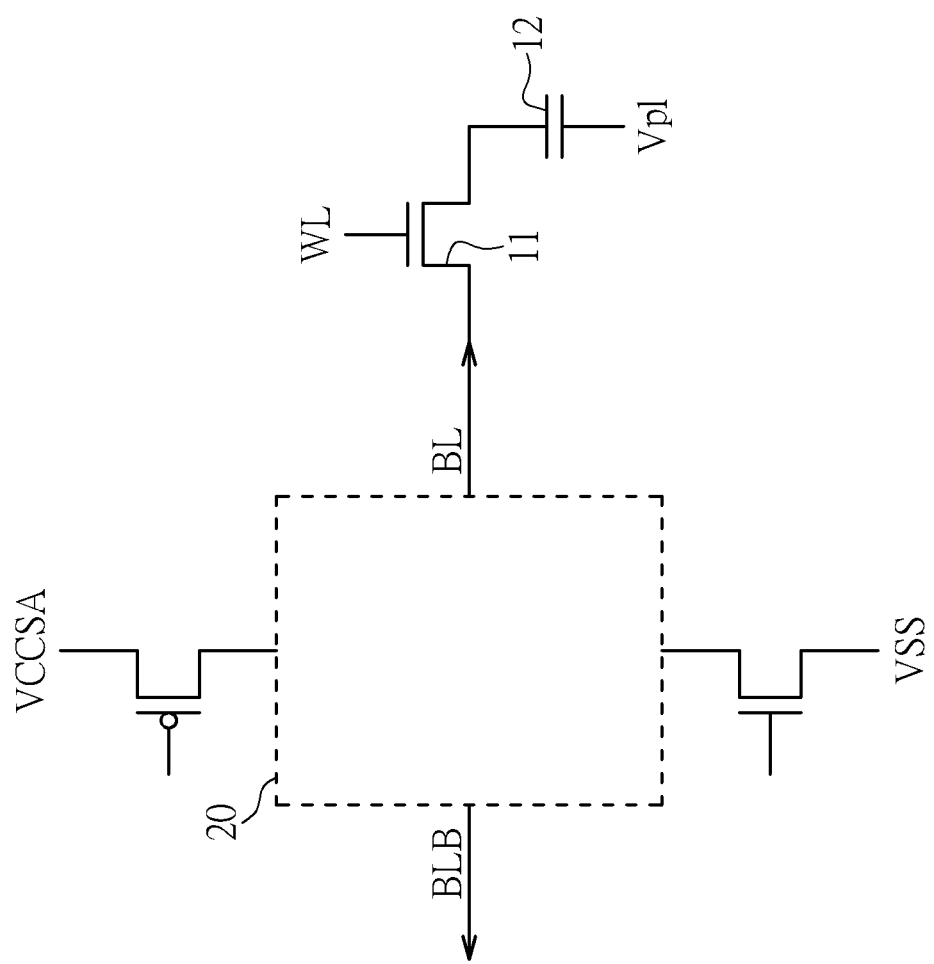
FIG. 1A illustrates commonly used design of the DRAM cell.
Figure 1B:
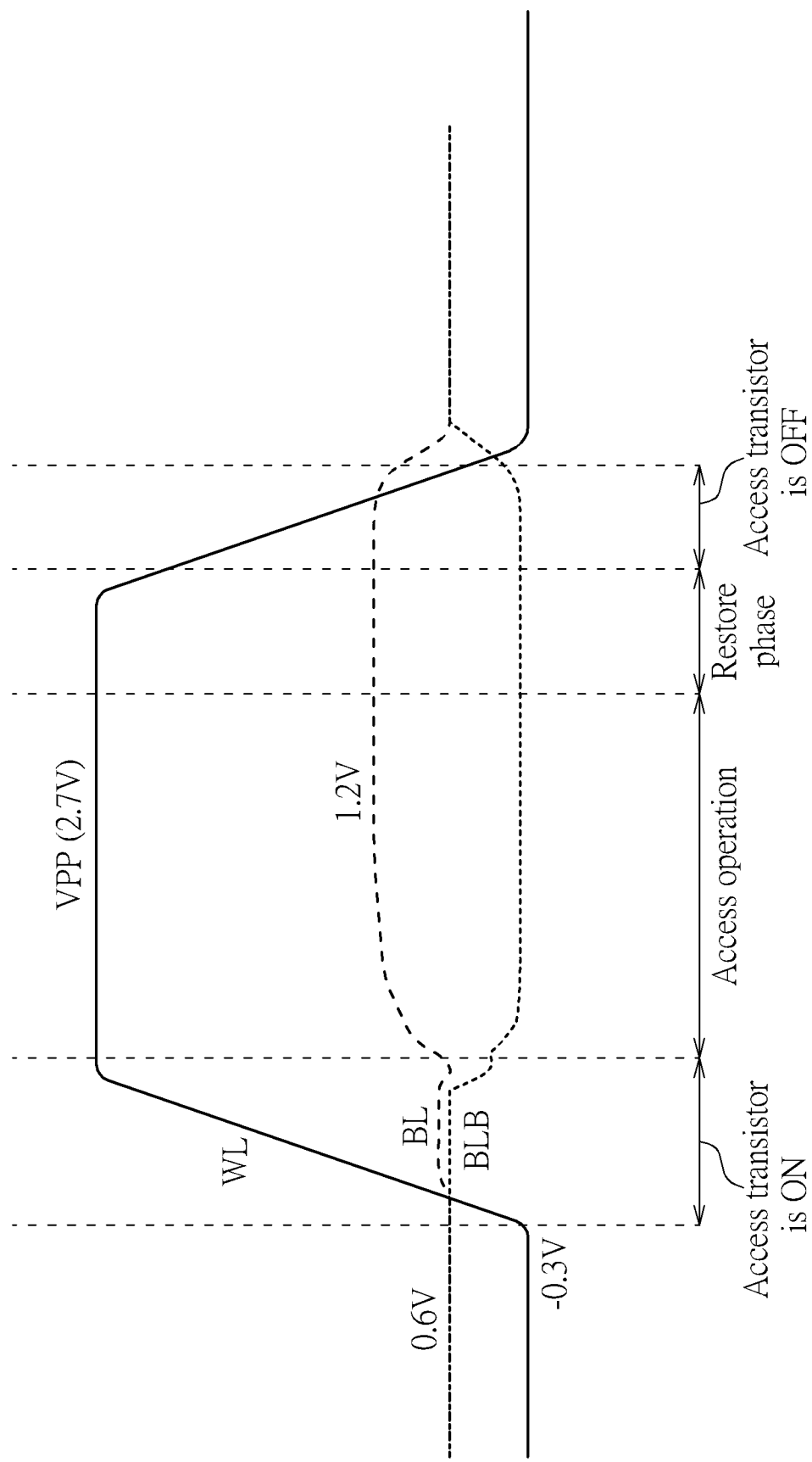
FIG. 1B illustrates the related signal waveforms during access (READ or WRITE) operation and the restore phase of most current DRAMs.

In addition, another embodiment to generate the word-line voltage VPP and the lower voltage VPP1 over the gate of the access transistor can use the voltage bootstrapped design technique. In addition, in another embodiment, switching between the word-line voltage VPP and the lower voltage VPP1 can be decided by the waveform of an accessed signal or bit-line which is developed to a certain magnitude. In another embodiment, in FIG. 2 the period between T3 and T4 is within 30%~60% of the period between T1 and T6 (that is, the "whole access cycle" which includes the access operation period and the restore phase period as referring to FIG. 1 and FIG. 2), such as within 40%~50%. In another embodiment, the total period for the word-line voltage VPP applied to the access transistor is less than 40%~70% of the whole access cycle, such as 50%~60%. To sum up, the present invention utilizes the novel shaped waveform applied to the word-line of the DRAM cell, so compared to the prior art, the present invention has advantages as follows: (a) high performance WRITE or READ operation of signals of the storage capacitor of the DRAM cell, respectively, (b) highly acceptable reliability, and (c) lower leakage current through the access transistor of the DRAM cell.

With the examples and explanations mentioned above, the features and spirits of the invention are hopefully well described. More importantly, the present invention is not limited to the embodiment described herein. Those skilled in the art will readily observe that numerous modifications and alterations of the device may be made while retaining the teachings of the invention.

What is claimed is:

1. A DRAM chip comprising:
   a DRAM cell; and
   an access transistor coupled to the DRAM cell, the access transistor comprising a gate terminal;
   wherein a whole access cycle comprises an access operation period and a restore phase period after the access operation period, when the whole access cycle begins, the gate terminal of the access transistor is initially applied by a first voltage level for a first portion of the access operation period and then applied by a second voltage level for a second portion of the access operation period before the restore phase period;
   wherein the first voltage level is higher than a sum of a threshold voltage of the access transistor and a voltage level of a signal ONE utilized in the DRAM chip, and the second voltage level is lower than the first voltage level.

2. The DRAM chip in claim 1, wherein the gate terminal of the access transistor is applied by the first voltage level during the restore phase period.

3. The DRAM chip in claim 1, wherein the gate terminal of the access transistor is applied by a third voltage level during the restore phase period and the third voltage level is different from the first voltage level but higher than the second voltage level.

4. The DRAM chip in claim 1, wherein a standby mode voltage level is applied to the gate terminal of the access transistor before the access operation period and after the restore phase period, and the standby mode voltage level is lower than a voltage level of a signal ZERO utilized in the DRAM chip.

5. The DRAM chip in claim 1, wherein a burn-in stress mode comprises a burn-in access period and a burn-in restore period after the burn-in access period, when the burn-in stress mode begins, a fourth voltage level higher than the first voltage level is initially applied to the gate terminal of the access transistor during a first portion of the burn-in access period and then applied by a fifth voltage level for a second portion of the burn-in access period, wherein the fifth voltage level is lower than the fourth voltage level.

6. A DRAM chip comprising:
   a DRAM cell with an access transistor, one terminal of the access transistor coupled to a word line;
   a first voltage source selectively coupled to the access transistor via the word line; and
   a second voltage source selectively coupled to the access transistor via the word line;
   wherein a whole access cycle comprises an access operation period and a restore phase period after the access operation period, and when the whole access cycle begins, the first voltage source is coupled to the one terminal of the access transistor for a first portion of the access operation period, rather than for the whole access operation period, wherein the first voltage source generates a first voltage level which is higher than a sum of a threshold voltage of the access transistor and a voltage level of a signal ONE utilized in the DRAM chip.

7. The DRAM chip in claim 6, wherein between an end of the first portion of the access operation period and a beginning of the restore phase period, the second voltage source is coupled to the one terminal of the access transistor for a second portion of the access operation period, wherein the second voltage source generates a second voltage level which is lower than the first voltage level.

8. The DRAM chip in claim 7, wherein the first voltage source is coupled to the one terminal of the access transistor during the restore phase period.

9. The DRAM chip in claim 8, wherein a period of the first voltage level totally applied to the access transistor is less than 70% of the whole access cycle.

10. The DRAM chip in claim 6, wherein a first switch is coupled between the first voltage source and the word line, and a second switch is coupled between the second voltage source and the word line, wherein the first voltage source is coupled to the one terminal of the access transistor when the first switch is on and the second voltage source is coupled to the one terminal of the access transistor when the second switch is on.

11. A DRAM chip comprising:
    a DRAM cell with an access transistor, wherein one terminal of the access transistor is coupled to a word line and another terminal of the access transistor is coupled to a bit line;
    wherein a whole access cycle comprises an access operation period and a restore phase period after the access operation period, a first voltage level is applied to the one terminal of the access transistor for a first portion of the access operation period, then a second voltage level is applied to the one terminal of the access transistor for a second portion of the access operation period before the restore phase period, and a third voltage level is applied to the one terminal of the access transistor for the restore phase period, wherein the first voltage level is higher than a sum of a threshold voltage of the access transistor and a voltage level of a signal ONE utilized in the DRAM chip, and the second voltage level is lower than the first voltage level.

12. The DRAM chip in claim 11, wherein the first voltage level is applied to the one terminal of the access transistor before the signal ONE of the bit line is well developed.

13. The DRAM chip in claim 11, wherein the second voltage level is lower than the first voltage level but higher than a voltage level of a signal ZERO utilized in the DRAM chip.

14. The DRAM chip in claim 11, wherein the first voltage level is substantially equal to the third voltage level.

15. The DRAM chip in claim 11, wherein a standby mode voltage level is applied to the one terminal of the access transistor before the access operation period and after the restore phase period, and the standby mode voltage level is lower than a voltage level of a signal ZERO utilized in the DRAM chip.

* * * * *